(12) United States Patent
Kindo

(10) Patent No.: US 7,759,808 B2
(45) Date of Patent: Jul. 20, 2010

(54) SEMICONDUCTOR SUBSTRATE INCLUDING FIRST AND SECOND RECOGNITION MARKS AND METHOD FOR MANUFACTURING SEMICONDUCTOR DEVICE

(75) Inventor: Osamu Kindo, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 90 days.

(21) Appl. No.: 12/285,831

(22) Filed: Oct. 15, 2008

(65) Prior Publication Data

US 2009/0102071 A1    Apr. 23, 2009

(30) Foreign Application Priority Data

Oct. 18, 2007    (JP)    .............. 2007-271205

(51) Int. Cl.
*H01L 23/544*    (2006.01)
*H01L 21/76*    (2006.01)
*H01L 21/00*    (2006.01)

(52) U.S. Cl. .............. 257/797; 257/E21.525; 257/E23.179; 438/401; 438/462; 438/975

(58) Field of Classification Search .......... 257/797, 257/E21.525, E23.179; 438/401, 462, 975
See application file for complete search history.

(56) References Cited

U.S. PATENT DOCUMENTS

| 5,684,333 | A | * | 11/1997 | Moriyama | 257/797 |
|---|---|---|---|---|---|
| 5,837,404 | A | * | 11/1998 | Lu | 430/5 |
| 6,238,939 | B1 | * | 5/2001 | Wachs et al. | 438/14 |
| 6,455,945 | B1 | * | 9/2002 | Ishii et al. | 257/797 |
| 6,638,671 | B2 | * | 10/2003 | Ausschnitt et al. | 430/22 |
| 7,282,421 | B2 | * | 10/2007 | Choi et al. | 438/401 |
| 7,427,459 | B2 | * | 9/2008 | Chen | 430/5 |
| 7,508,051 | B2 | * | 3/2009 | Scheucher | 257/620 |
| 7,554,211 | B2 | * | 6/2009 | Kida et al. | 257/797 |
| 7,563,694 | B2 | * | 7/2009 | Burnside et al. | 438/462 |
| 2002/0130425 | A1 | * | 9/2002 | Koike et al. | 257/797 |
| 2007/0108638 | A1 | * | 5/2007 | Lane et al. | 257/797 |
| 2008/0023802 | A1 | * | 1/2008 | Suzuki | 257/620 |

FOREIGN PATENT DOCUMENTS

JP    2002-246336    8/2002

* cited by examiner

*Primary Examiner*—Ida M Soward
(74) *Attorney, Agent, or Firm*—McGinn IP Law Group, PLLC

(57) ABSTRACT

The present invention includes a first recognition mark which is arranged in a frame part of a perimeter of an implementation region having a plurality of semiconductor chips implemented therein so that the position of the semiconductor substrate can be macroscopically detected by using a recognition camera, and a second recognition mark which is formed into a smaller shape than the first recognition mark so that the position of the dividing line can be microscopically detected by using a recognition camera. The second recognition mark is arranged so that its center line is positioned on a line that extends from a dicing line, and has a pattern shape which is formed so as to be linearly symmetric with respect to the center line. This pattern shape is formed so that the ratio of a length occupying a direction parallel to the dicing line is larger than that occupying a direction perpendicular to the dicing line, and includes a flow region for promoting the flow of an etchant for forming the pattern shape.

11 Claims, 8 Drawing Sheets

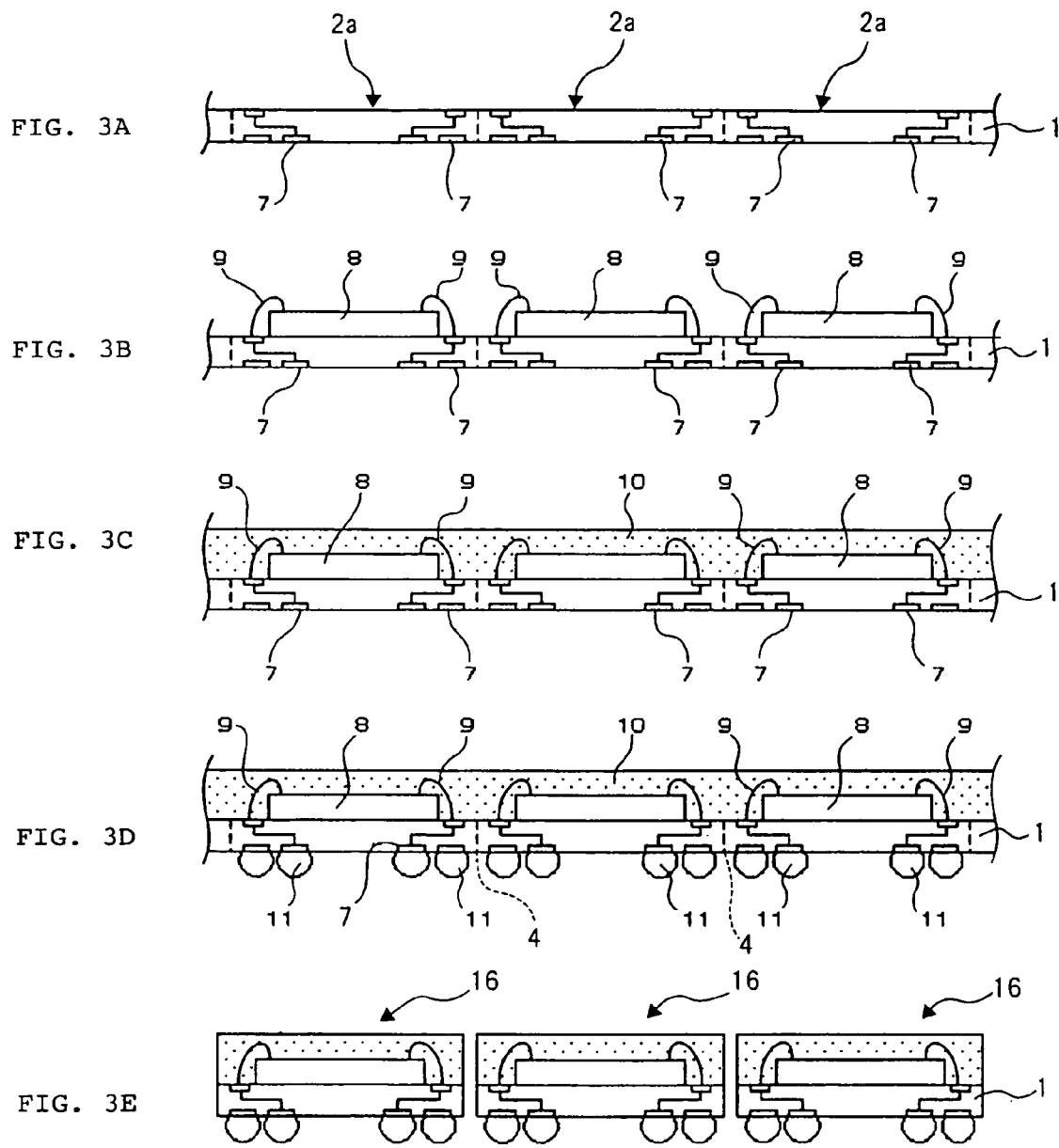

FIG. 5
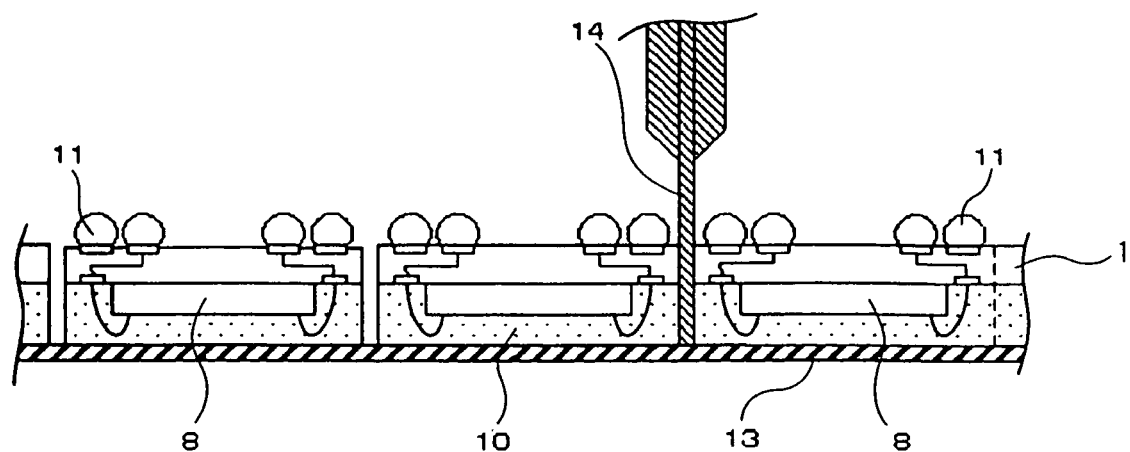
FIG. 6A
FIG. 6B
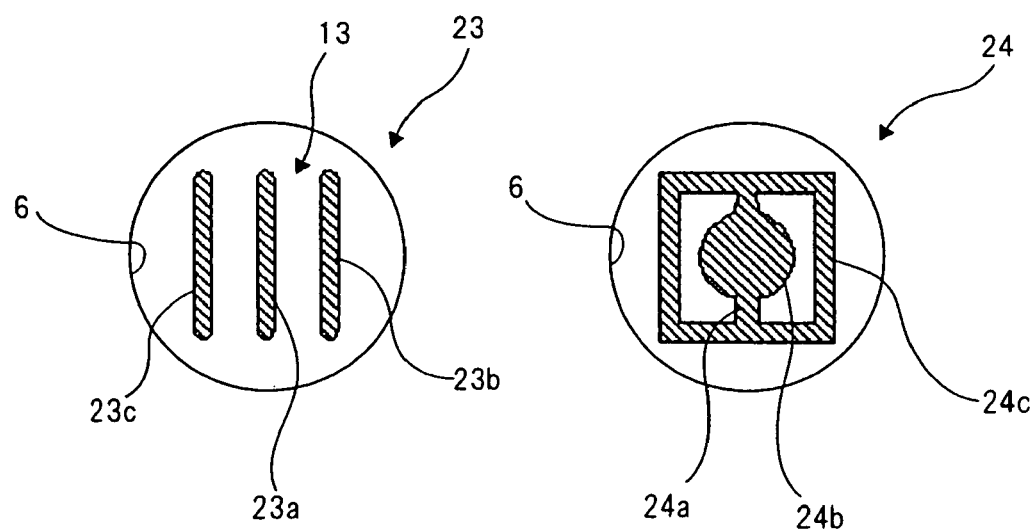

SEMICONDUCTOR SUBSTRATE INCLUDING FIRST AND SECOND RECOGNITION MARKS AND METHOD FOR MANUFACTURING SEMICONDUCTOR DEVICE

BACKGROUND OF THE INVENTION

1. Field of the Invention

The present invention relates to a semiconductor substrate having a plurality of semiconductor elements arrayed and implemented thereon in a manufacturing process of a semiconductor device, and a method for manufacturing a semiconductor device using the semiconductor substrate.

2. Description of the Related Art

In recent years, the requirement has arisen for semiconductor device (hereinafter referred to as a semiconductor package) is required to be miniaturized so that they can be mounted on a small electronic equipment such as a portable telephone. For this reason, in a BGA (Ball Grid Array) type of a semiconductor package, miniaturizing the semiconductor package is proceeded by making a wiring board having a semiconductor element (hereinafter referred to as a semiconductor chip) that is to be mounted thereon smaller.

Thus, a semiconductor package which is formed into a size approximately equal to that of the semiconductor chip can be practically used. As a result, the area occupied by the semiconductor chip in the wiring board has been increasing. Along with the increase, dimensional tolerance required in the manufacturing process of the semiconductor package has become much severer. Generally, the progress for manufacturing a semiconductor package includes a step of dicing the substrate, which is the step of cutting the semiconductor substrate, on which a plurality of the semiconductor chips have been implemented, along a dividing line (hereinafter referred to as dicing line) into individual semiconductor packages and separating them. Accordingly, it has become necessary to enhance the accuracy of the dicing position of the wiring board.

Such a process of dicing a substrate includes: firstly detecting the position of a semiconductor substrate by making a recognition camera that has a comparatively low magnification and a wide field of view recognize a large recognition mark which is arranged in four corners of the semiconductor substrate and which can be comparatively easily detected; subsequently detecting the position of a dicing line by making the recognition camera which has retained the magnification, as is, recognize a pattern shape that configures the recognition mark arranged on each dicing line; and finally dicing the semiconductor substrate while referring to the position of the detected dicing line. The method uses a recognition camera of low magnification when making the camera recognize the position of the dicing line by using the recognition mark. Therefore, the accuracy in the method is shown to be inferior to the processing accuracy in a process of dicing wafers when a recognition camera that has high magnification is caused to recognize the dicing position.

In addition, a technology for dicing the semiconductor substrate in relation to the present invention is disclosed in Japanese Patent Laid-Open No. 2002-246336 (FIG. 2). In this patent publication, the wiring board has recognition marks that have a rectangle of 0.3 mm×0.5 mm arranged on lines that extend from the dicing lines for cutting the substrate into individual semiconductor packages in the perimeter of the wiring board. The patent publication also discloses a method for dicing the wiring board through recognizing the position of the dicing line while referring to the two recognition marks in positions that face each other.

By the way, as was described above, the recognition mark provided on the wiring board is formed by an etching technique or the like simultaneously with the formation of the wiring pattern which will become a product. For this reason, when the wiring pattern is etched in the process of manufacturing the wiring board, a so-called sag is formed which means that a broken shape in one part of the perimeter of the pattern shape that configures the recognition mark occurs due to dissolution by an etchant. Such a sag in the pattern shape is more remarkable when the wiring pattern formed in the wiring board is made more microscopic. Accordingly, it is difficult to make a shape having a fine pattern shape with such accuracy that the pattern center can be stably detected.

When the sag is formed in the pattern shape configuring the recognition mark, the camera cannot stably recognize the position of the pattern center, which causes the misalignment of the dicing position of the wiring board. When the misalignment of the dicing position has occurred, the wiring pattern of the wiring board and a wire for electrically connecting the wiring board with the semiconductor chip may be cut.

In addition, in the process of dicing the substrate, it is desirable that the pattern shape that configures the recognition mark that causes a dicing device to recognize the dicing position be a characteristic shape so as to make the dicing device easily detect the recognition mark, and it is desirable that the pattern shape have a symmetric shape so as to enable the dicing device to have sufficient accuracy. It is also thought that the pattern shape that configures the recognition mark should be into a fine shape in order to achieve further accurate recognition with the use of a recognition camera having high magnification and a narrow field of view. However, when the recognition mark is formed to have a fine pattern shape in the step of forming the wiring pattern on the substrate, the pattern shape in the recognition mark will vary and consequently becomes unusable as the pattern shape. Then, it is difficult to employ a method of detecting the position by using a recognition camera having high magnification in the step of dicing the substrate, and accordingly it is necessary to secure large dimensional tolerance, which prevents miniaturization of the semiconductor package.

The recognition mark disclosed in the above described Patent document 1 has a problem in which the a corner part of the pattern shape which is formed into a rectangle is dissolved in the etchant which causes the pattern shape to easily break which causes the recognition mark be barely detectable. In addition, the pattern shape of the recognition mark is formed into a rectangle which is similar to the wiring pattern formed on the wiring board, which causes a problem that one part of the wiring pattern is easy to be wrongly recognized as the recognition pattern.

SUMMARY

The present invention seeks to solve one or more of above problems, or to improve upon those problems at least in part.

In one embodiment, there is provided a first semiconductor substrate according to the present invention comprises: a plurality of semiconductor elements which are arrayed in a matrix form and which are implemented thereon; a dividing line for cutting the plurality of the implemented semiconductor elements into the individual elements and separating them; a first recognition mark which is arranged in the frame part of the perimeter of the implementation region having a plurality of semiconductor elements implemented therein so that the position of the semiconductor substrate can be macroscopically detected by detecting means; and a second recognition mark which is formed into a smaller shape than the first recognition mark so that the position of the dividing line can be microscopically detected by detecting means. The second recognition mark is arranged so that its center line is positioned on a line that extends from the dividing line, and has a pattern shape which is formed so as to be linearly symmetric with respect to the center line. The pattern shape is formed so that the ratio in a direction parallel to the dividing line is larger than that in a direction perpendicular to the dividing line, and includes a flow region for promoting the flow of the etchant in order to form the pattern shape.

A second semiconductor substrate according to the present invention comprises: a plurality of semiconductor elements which are arrayed in a matrix form and which are implemented thereon; a dividing line for cutting the plurality of the implemented semiconductor elements into individual elements and separating them; a first recognition mark which is arranged in the frame part of the perimeter of the implementation region having a plurality of semiconductor elements implemented therein so that the position of the semiconductor substrate can be macroscopically detected by detecting means; a second recognition mark which is formed into a smaller shape than the first recognition mark so that the position of the dividing line can be microscopically detected by detecting means. The second recognition mark is arranged so that its center line is positioned on a line that extends from the dividing line, and has a pattern shape which is formed so as to be linearly symmetric with respect to the center line. The pattern shape is configured by a combination of a plurality of simple figures.

A method for manufacturing a semiconductor device according to the present invention includes: a first step of preparing a semiconductor substrate according to the above described present invention, and detecting a position of the semiconductor substrate by making a recognition camera recognize a first recognition mark; a second step of detecting a position of a dividing line of the semiconductor substrate by making the recognition camera having increased magnification recognize a second recognition mark; and a third step of cutting the semiconductor substrate along the dividing line.

The manufacturing method according to the present invention can improve detection accuracy for detecting the position of a second recognition mark having a fine pattern shape. Accordingly, the manufacturing method according to the present invention can decrease the dimensional tolerance of a semiconductor substrate and miniaturize a semiconductor device.

BRIEF DESCRIPTION OF THE DRAWINGS

The above features and advantages of the present invention will be more apparent from the following description of certain preferred embodiments taken in conjunction with the accompanying drawings, in which:

FIGS. 3A, 3B, 3C, 3D and 3E are sectional views for describing a method for manufacturing a semiconductor device with the use of the above described semiconductor packaging substrate;

FIG. 5 is a sectional view illustrating a step of dicing a substrate;

FIGS. 6A and 6B are plan views illustrating other examples of the above described second recognition mark;

DETAILED DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

Figure 1:
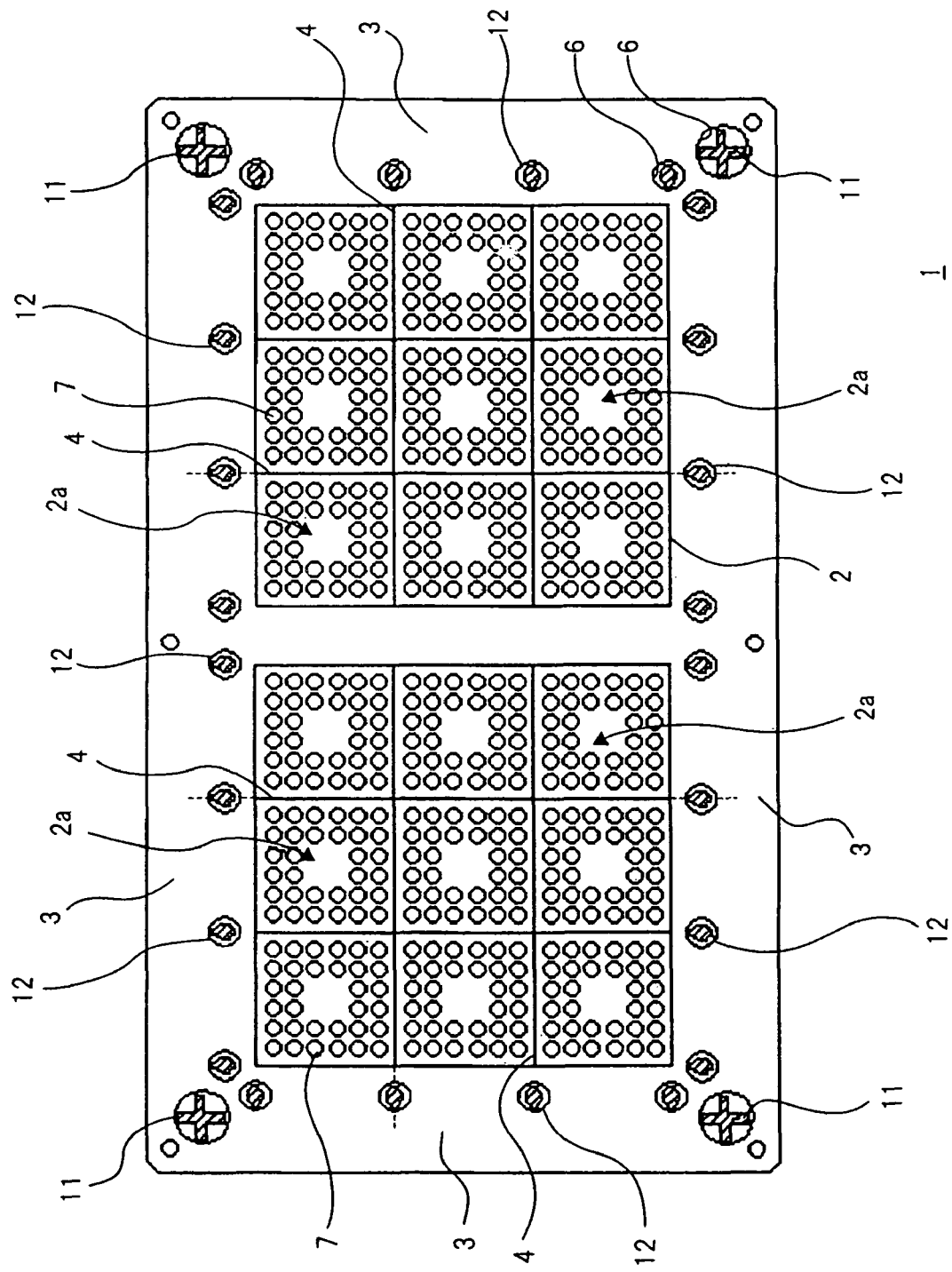
FIG. 1 is a plan view illustrating a semiconductor packaging substrate according to an exemplary embodiment.

FIG. 1 illustrates a plan view of semiconductor packaging substrate 1 according to a first exemplary embodiment. Referring now to FIG. 1, semiconductor packaging substrate 1 according to a first embodiment of the present invention includes: implementation region 2 in which a plurality of semiconductor chips are arrayed in a matrix form and implemented; frame part 3 that forms a quadrangle arranged in the perimeter of implementation region 2; and a plurality of dicing lines 4 (dividing line) for cutting a plurality of the semiconductor chips which are implemented in implementation region 2 into individual chips and for separating them.

In implementation region 2 of semiconductor packaging substrate 1, a plurality of unit substrates 2a configuring semiconductor packages are arrayed in a matrix form. In frame part 3 of this semiconductor packaging substrate 1, a plurality of first recognition marks 11 are arranged so as to make a recognition camera (not shown), which is detecting means, macroscopically detect the position of semiconductor packaging substrate 1, and a plurality of second recognition marks 12 are also arranged so as to make the recognition camera microscopically detect the position of dicing line 4, respectively.

First recognition marks 11 are arranged at four corners of frame part 3 respectively, and have a cross-shaped pattern. Second recognition mark 12 is formed into a smaller size than first recognition mark 11, and is arranged on a line that extends from dicing line 4, within frame part 3.

Furthermore, this first recognition mark 11 is formed so as to have a diameter of approximately 1 mm, and second recognition mark 12 is formed so as to have a diameter of approximately 400 µm. First recognition mark 11 and second recognition mark 12 are exposed from circular opening 6 that is made in a solder resist which covers semiconductor packaging substrate 1.

Figure 2:
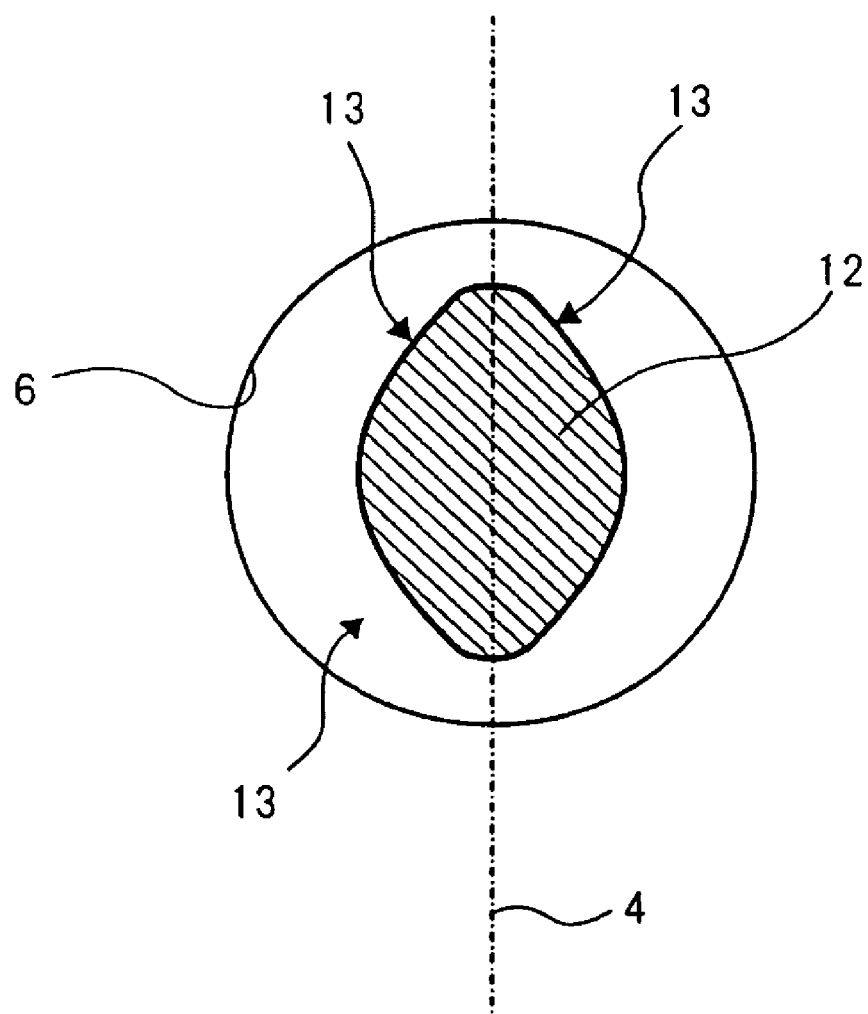
FIG. 2 is a plan view illustrating a second recognition mark on the above described semiconductor packaging substrate.

Second recognition mark 12 is arranged so that its center line is positioned on a line that extends from dicing line 4, and has a pattern shape which is linearly symmetric with respect to the center line. FIG. 2 illustrates a plan view of second recognition mark 12 which is formed into a fine pattern shape. The pattern shape is formed into an oval shape such that the long axis is positioned on the line that extends from dicing line 4, and such that the ratio of a length occupying a direction parallel to dicing line 4 is larger than that occupying a direction perpendicular to dicing line 4, as is illustrated in FIG. 2. The pattern shape also includes linear flow region 13 for promoting the flow of an etchant when the pattern shape is formed in the perimeter of the oval shape.

That is to say, a fine pattern shape configuring second recognition mark 12 includes flow region 13. Accordingly, when a pattern shape is formed simultaneously with semiconductor packaging substrate 1 being etched to form a wiring pattern thereon, the etchant can uniformly flow with respect to the pattern shape. Thereby, the etchant can inhibit the formation of a sag which is a broken shape, for instance, in one part of the perimeter in the fine pattern shape. Thus, even when second recognition mark 12 is formed into a fine pattern shape, second recognition mark 12 can be formed into a stable shape with respect to the center of the pattern shape.

When the pattern shape of second recognition mark 12 is formed to have such a configuration whose size which fits into the comparatively narrow field of view of a recognition camera having high magnification, the dicing position can be detected with higher accuracy, and processing accuracy in the step of dicing the substrate can be improved.

Next, a method for manufacturing a semiconductor package of the exemplary embodiment will now be described below with reference to FIGS. 3A to 3E, FIGS. 4A to 4C, and FIG. 5.

Firstly, semiconductor packaging substrate 1 is prepared in which a plurality of unit substrates 2a are arrayed into a matrix form, and in which first recognition mark 11 and second recognition mark 12 are formed in predetermined positions of frame part 3, as is illustrated in FIG. 1 and FIG. 3A. As is illustrated in FIG. 3B, semiconductor chips 8 are each mounted on the surface of one side of unit substrate 2a, and an electrode pad of semiconductor chip 8 is electrically connected with a wiring pattern of unit substrate 2a, for instance, with the use of wire 9.

Subsequently, sealing part 10 that collectively covers a plurality of unit substrates 2a is formed on semiconductor packaging substrate 1 which has a configuration in which semiconductor chips 8 are mounted on respective unit substrates 2a, as is illustrated in FIG. 3C. The exemplary embodiment adopts a configuration of dividing sealing part 10 into two parts in order to inhibit unit substrate 2a from being warped.

Next, in semiconductor packaging substrate 1 having sealing part 10 formed thereon, solder balls 11 are respectively mounted on a plurality of lands 7 which are provided on the surface of the other side of unit substrate 2, as is illustrated FIG. 1 and FIG. 3D.

Subsequently, regarding semiconductor packaging substrate 1 of the exemplary embodiment, a step of detecting the positions of semiconductor packaging substrate 1 and dicing line 4 and a step of dicing the substrate will now be described below.

A method for manufacturing a semiconductor package according to the exemplary embodiment includes: a first step for macroscopically detecting a position of semiconductor packaging substrate 1 by causing first recognition mark 11 to be recognized after assembling a semiconductor package; a second step for microscopically detecting a position of dicing line 4 with the use of second recognition mark 12; and a third step of cutting semiconductor packaging substrate 1 along dicing line 4 to dice semiconductor packaging substrate 1 into each unit substrate 2a.

Figure 4A:
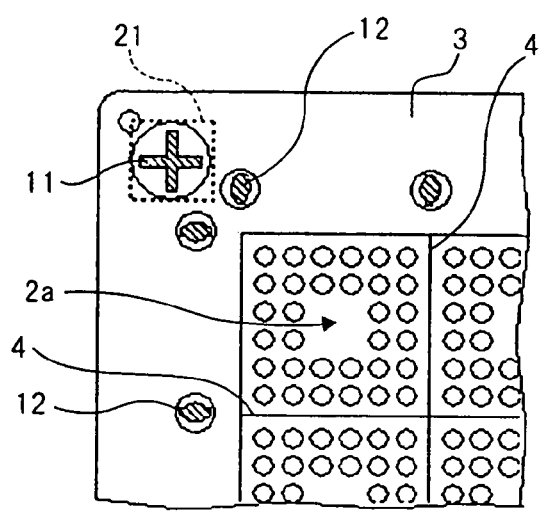
FIGS. 4A, 4B and 4C are views for describing a first recognition mark and a second recognition mark on the above described semiconductor packaging substrate.
Figure 4B:
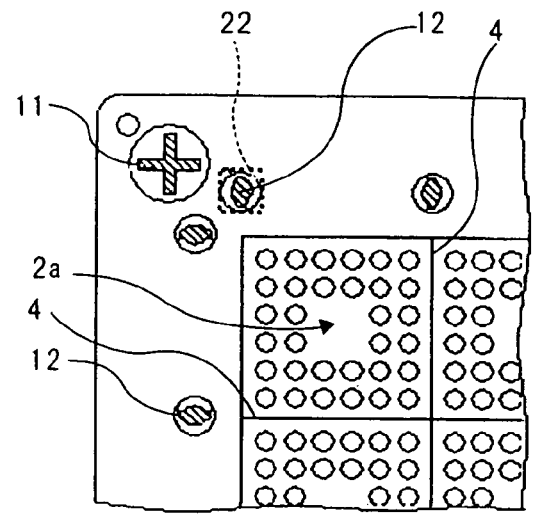
Figure 4C:
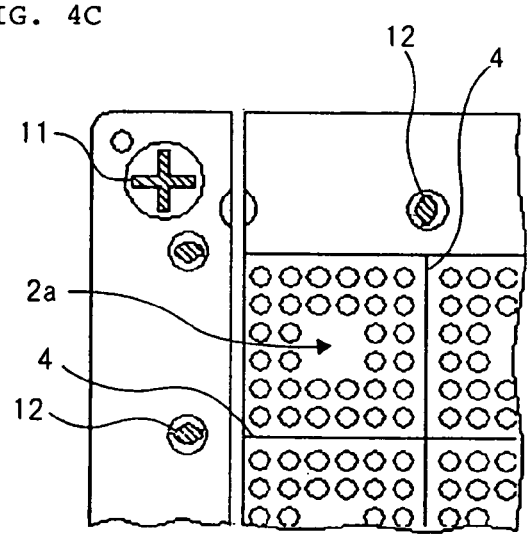

The method includes firstly detecting the position of semiconductor packaging substrate 1 by causing a pattern shape that configures first recognition marks 11 which are arranged on four corners of frame part 3 of semiconductor packaging substrate 1 and which are comparatively large to be recognized through recognition area 21 of a recognition camera which has comparatively low magnification and a wide field of view, as is illustrated in FIG. 4A. The method includes subsequently detecting the position of dicing line 4 by changing a recognition camera having low magnification to that of high magnification, and by causing a fine pattern shape that configures second recognition mark 12 which is arranged on a line that extends from each dicing line 4 to be recognized through recognition area 22 of the recognition camera, as is illustrated in FIG. 4B. The method includes finally dicing semiconductor packaging substrate 1 while referring to the position of detected dicing line 4, as is illustrated in FIG. 4C.

The step of dicing the substrate includes adhesively fixing sealing part 10 of semiconductor packaging substrate 1 to dicing tape 13, cutting semiconductor packaging substrate 1 into individual semiconductor packages 16, by making rapidly rotated dicing blade 14 of the dicing device grind semiconductor packaging substrate 1 along the position of dicing line 4 which has been recognized through the pattern shape configuring second recognition mark 12, and separating them, as is illustrated in FIG. 5.

A plurality of semiconductor packages 16 can be obtained, by thus cutting and separating semiconductor packaging substrate 1 into each unit substrate 2a, as is illustrated in FIG. 3E.

In the exemplary embodiment, the recognition width of a recognition camera with high magnification is set at 500 μm or less, and a second recognition mark is formed into a size of approximately 400 μm. Second recognition mark 12 is formed into an oval pattern shape which is comparatively difficult to have a sag made by an etchant, and is detected with the use of a recognition camera of high magnification. Accordingly, the method according to the exemplary embodiment can detect the position of dicing line 4 with higher accuracy compared to a method that uses a wiring board containing no fine pattern shape. As a result, the method can improve accuracy for the cut position (dicing position) of the wiring board, and can accordingly set dimensional tolerance at a small value, and consequently manufacture a semiconductor package having a size approximately equal to that of a semiconductor chip.

The method according to the exemplary embodiment can improve detection accuracy for the position by applying second recognition mark 12 as a recognition mark to be used not only in the step of dicing the substrate but also in other processing devices, and this method can realize a semiconductor package that features high density mounting in which there is little room for large dimensional tolerance.

Other Exemplary Embodiments

In the above described exemplary embodiment, the pattern shape which configures second recognition mark 12 is formed into an oval shape, but may also be another shape other than the oval shape, as long as the shape can cause an etchant to flow uniformly therein and inhibit a sag from being formed. Other examples of the shape which can cause the etchant to flow uniformly therein include a shape as illustrated in FIG. 6A.

As is illustrated in FIG. 6A, the pattern shape of second recognition mark 23 has linear part 23a which is arranged on a line that extends from dicing line 4, and a pair of linear parts 23b and 23c which are arranged in parallel so as to sandwich this linear part 23a. In this pattern shape, spaces among each linear part 23a, 23b and 23c work as flow region 13 for promoting the flow of an etchant when the pattern shape is formed. Accordingly, the pattern shape can be formed into a stable shape with respect to the center of the pattern shape.

Another shape which can cause the pattern shape to be detected even when a sag is formed in the pattern shape includes a shape as illustrated in FIG. 6B.

As is illustrated in FIG. 6B, the pattern shape of second recognition mark 24 has linear part 24a which is positioned on dicing line 4, circular part 24b whose center line is positioned on dicing line 4, and quadrangular frame part 24c which surrounds this circular part 24b, and is configured by a combination of a plurality of simple figures. The above simple figure according to the present invention is a comparatively plain figure such as a circle, a quadrangle and a straight line, and is configured, for instance, by such a combination in which one simple figure is arranged in the inner side of another simple figure.

When the pattern shape is thus configured by the combination of the simple figures, the position of the center of a fine pattern shape can be detected by the reciprocal action of another figure or a plurality of figures, even if the shape of any simple figure in the fine pattern shape is broken.

Figure 7:
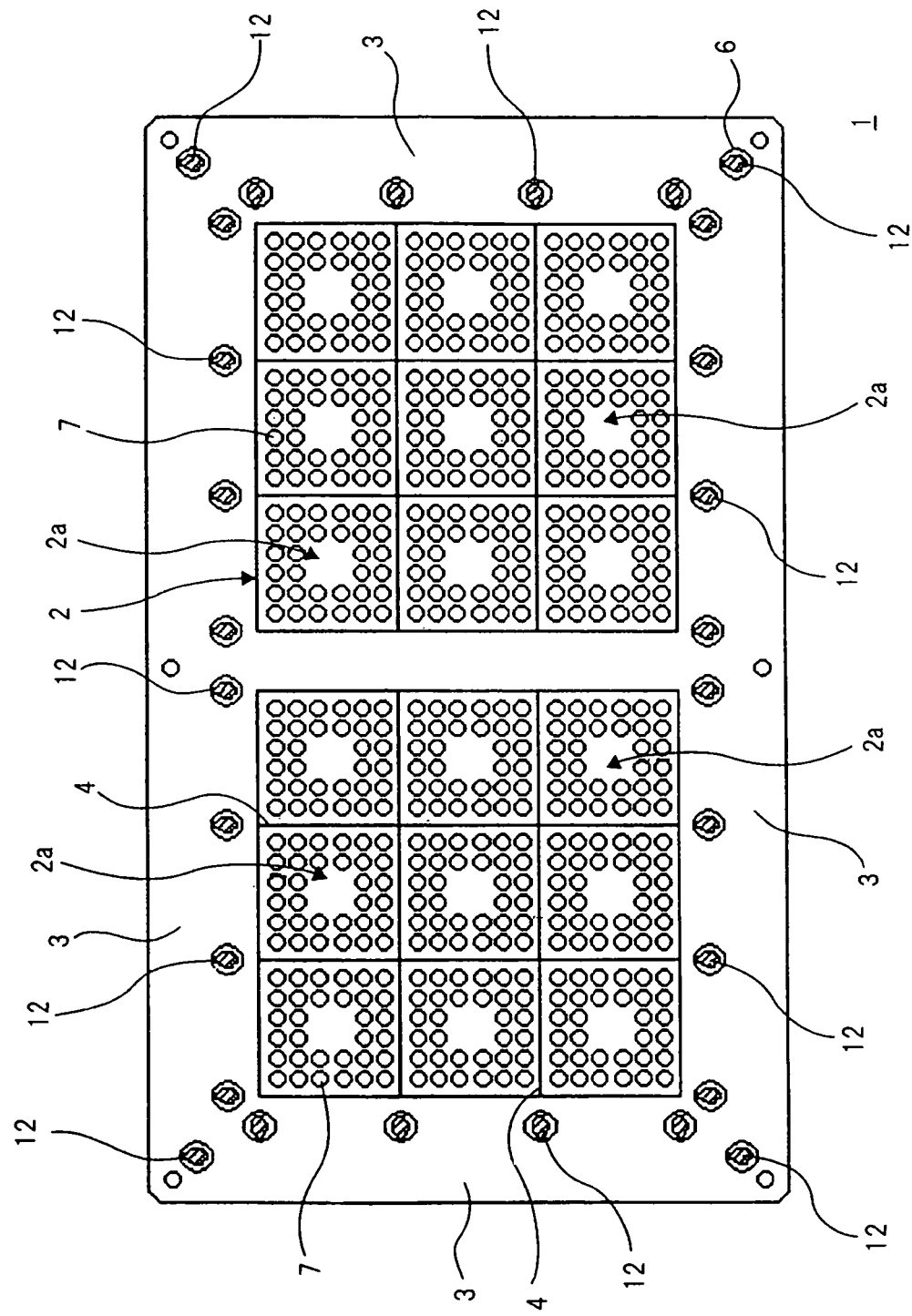
FIG. 7 is a plan view illustrating another semiconductor packaging substrate which is provided with the above described second recognition mark.

As is illustrated in FIG. 7, second recognition mark 12 may also be used, for instance, as a measurement reference point when the dimension of a substrate is measured by an automatic measuring machine.

Figure 8:
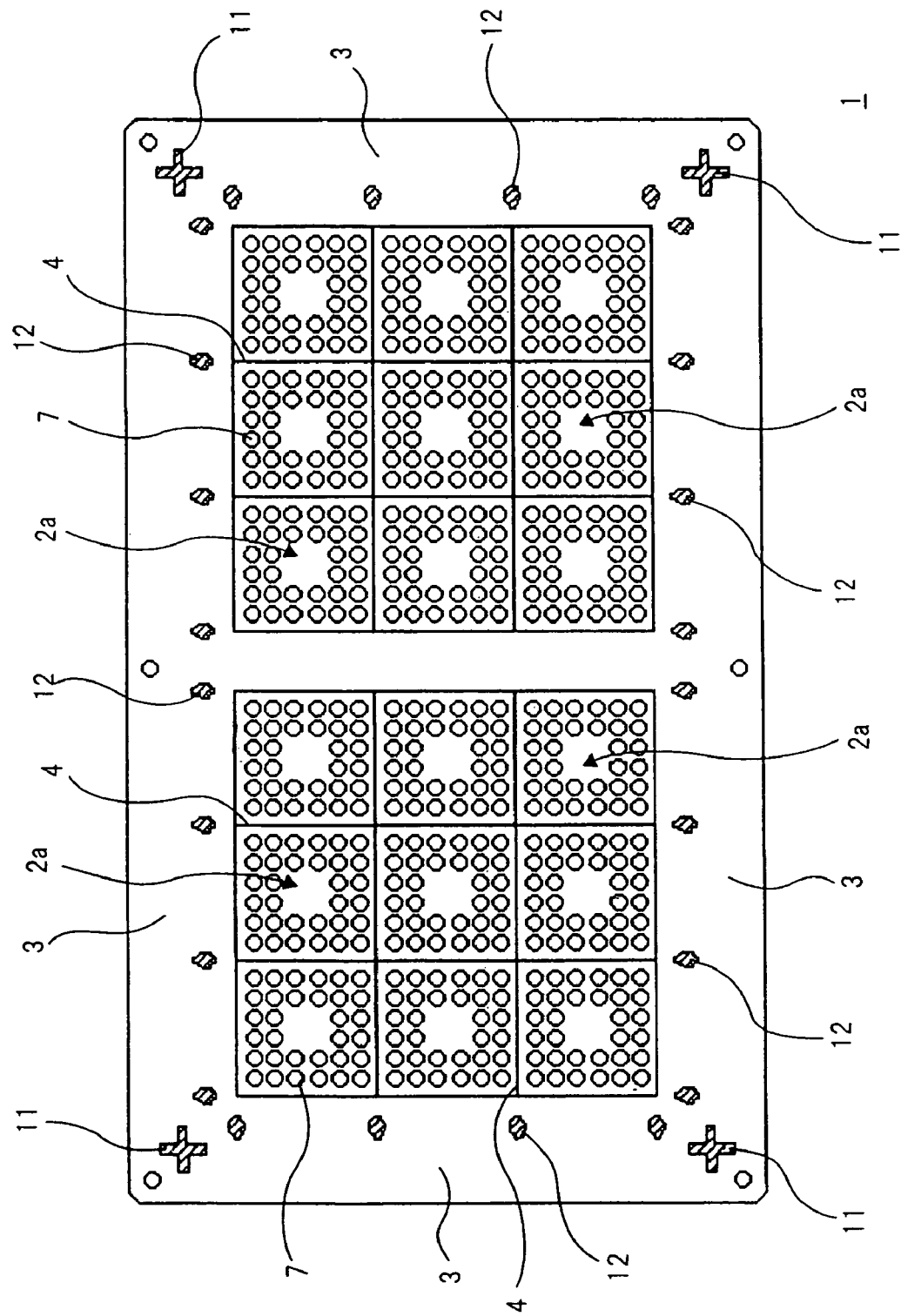
FIG. 8 is a plan view illustrating another semiconductor packaging substrate which is provided with another second recognition mark.

In addition, the above described exemplary embodiment adopts a configuration in which the pattern shape configuring second recognition mark 12 is exposed from opening 6 of a solder resist, but alternatively may adopt a configuration in which the pattern shapes of first recognition mark 11 and second recognition mark 12 are covered with the solder resist, as is illustrated in FIG. 8.

Figure 9:
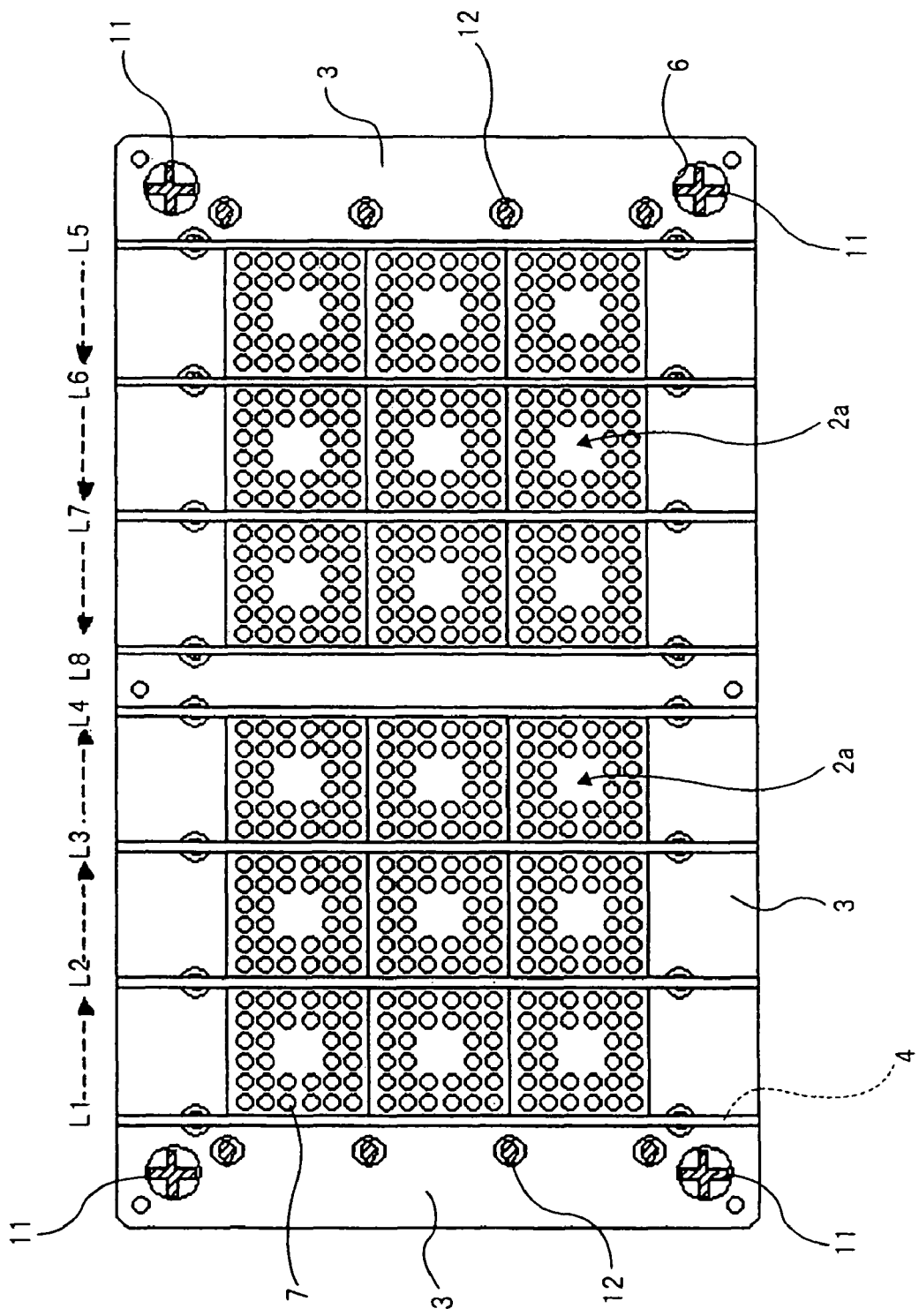
FIG. 9 is a plan view for describing a cutting method in a step of dicing a substrate.

The step of dicing the substrate includes cutting semiconductor packaging substrate 1 along dicing line 4 which has been detected by second recognition mark 12, in the order of the positions from the end of the substrate to the center of the substrate, in other words, in the order of L1 to L4 and L5 to L8, as is illustrated in FIG. 9. Thereby, the order can equalize the stress concentration which is applied to each semiconductor package when the substrate is cut, and consequently can further improve the accuracy of the position to be cut.

In addition, the semiconductor substrate according to the present invention is preferably adopted in all steps where it is necessary to recognize the position of the semiconductor substrate in a manufacturing process of the semiconductor device.

It is apparent that the present invention is not limited to the above embodiments, but may be modified and changed without departing from the scope and spirit of the invention.

What is claimed is:

1. A semiconductor substrate comprising a plurality of semiconductor elements which are arrayed in a matrix form and which are implemented,
    a dividing line on which the plurality of the implemented semiconductor elements are cut and separated into the individual elements,
    a first recognition mark which is arranged in a frame part of a perimeter of an implementation region having the plurality of the semiconductor elements implemented therein so that the position of the semiconductor substrate can be macroscopically detected by using a recognition camera, and
    a second recognition mark which is formed into a smaller shape than the first recognition mark so that the position of the dividing line can be microscopically detected by using the recognition camera, wherein
    the second recognition mark has a pattern shape which is arranged so that its center line is positioned on a line that extends from the dividing line and which is formed so as to be linearly symmetric with respect to the center line, and
    the pattern shape is formed so that a ratio of a length occupying a direction parallel to the dividing line is larger than that occupying a direction perpendicular to the dividing line, and includes a flow region for promoting the flow of an etchant for forming the pattern shape.

2. The semiconductor substrate according to claim 1, wherein the second recognition mark has the pattern shape which is formed into an oval shape such that the long axis is positioned on the line that extends from the dividing line.

3. The semiconductor substrate according to claim 1, wherein the second recognition mark has the pattern shape which has a linear part which is arranged on the line that extends from the dividing line and said pattern shape has a pair of other linear parts which are arranged in parallel so as to sandwich said linear part.

4. A method for manufacturing a semiconductor device comprising:
    firstly preparing the semiconductor substrate according to claim 1, and detecting a position of the semiconductor substrate by making a recognition camera recognize the first recognition mark;
    secondly detecting a position of the dividing line of the semiconductor substrate by making the recognition camera with increased magnification recognize the second recognition mark; and
    thirdly cutting the semiconductor substrate along the dividing line.

5. A semiconductor substrate comprising a plurality of semiconductor elements which are arrayed in a matrix form and which are implemented,
    a dividing line on which the plurality of the implemented semiconductor elements are cut and separated into the individual elements,
    a first recognition mark which is arranged in a frame part of a perimeter of an implementation region having the plurality of the semiconductor elements implemented therein so that the position of the semiconductor substrate can be macroscopically detected by using a recognition camera, and
    a second recognition mark which is formed into a smaller shape than the first recognition mark so that the position of the dividing line can be microscopically detected by using the recognition camera, wherein
    the second recognition mark has a pattern shape which is arranged so that its center line is positioned on a line that extends from the dividing line and which is formed so as to be linearly symmetric with respect to the center line, and the pattern shape is configured by a combination of a plurality of simple figures.

6. The semiconductor substrate according to claim 5, wherein the second recognition mark has the pattern shape which has a circular part which is positioned on the dividing line and a quadrangular frame part which surrounds the circular part.

7. A semiconductor substrate comprising a plurality of semiconductor elements which are arrayed in a matrix form and which are implemented,
    a dividing line on which the plurality of the implemented semiconductor elements are cut and separated into the individual elements,
    a first recognition mark which is arranged in a frame part of a perimeter of an implementation region having the plurality of the semiconductor elements implemented therein so that the position of the semiconductor substrate can be macroscopically detected by using detecting means, and a second recognition mark which is formed into a smaller shape than the first recognition mark so that the position of the dividing line can be microscopically detected by using the detecting means, wherein the second recognition mark has a pattern shape which is arranged so that its center line is positioned on a line that extends from the dividing line and which is formed so as to be linearly symmetric with respect to the center line, and the pattern shape is formed so that a ratio of a length occupying a direction parallel to the dividing line is larger than that occupying a direction perpendicular to the dividing line and includes a flow region for promoting the flow of an etchant for forming the pattern shape.

8. The semiconductor substrate according to claim 7, wherein the second recognition mark has the pattern shape which is formed into an oval shape such that the long axis is positioned on the line that extends from the dividing line.

9. The semiconductor substrate according to claim 7, wherein the second recognition mark has the pattern shape which has a linear part which is arranged on the extending line of the dividing line and said pattern shape has a pair of other linear parts which are arranged in parallel so as to sandwich said linear part.

10. A semiconductor substrate comprising a plurality of semiconductor elements which are arrayed in a matrix form and which are implemented, a dividing line on which the plurality of the implemented semiconductor elements are cut and separated into the individual elements, a first recognition mark which is arranged in a frame part of a perimeter of an implementation region having the plurality of the semiconductor elements implemented therein so that the position of the semiconductor substrate can be macroscopically detected by using detecting means, and a second recognition mark which is formed into a smaller shape than the first recognition mark so that the position of the dividing line can be microscopically detected by using the detecting means, wherein the second recognition mark has a pattern shape which is arranged so that its center line is positioned on a line that extends from the dividing line and which is formed so as to be linearly symmetric with respect to the center line, and the pattern shape is configured by a combination of a plurality of simple figures.

11. The semiconductor substrate according to claim 10, wherein the second recognition has the pattern shape which has a circular part which is positioned on the dividing line and a quadrangular frame part which surrounds the circular part.

* * * * *